United States Patent [19]
Lim

[11] Patent Number: 5,929,790
[45] Date of Patent: Jul. 27, 1999

[54] ANALOG TO DIGITAL CONVERTER KEYPAD METHOD AND APPARATUS

[75] Inventor: Joon-Woo Lim, Sungnam-shi, Rep. of Korea

[73] Assignee: SamSung Electronics Co., Ltd., Suwon, Rep. of Korea

[21] Appl. No.: 08/861,825

[22] Filed: May 23, 1997

[30] Foreign Application Priority Data

May 27, 1996 [KR] Rep. of Korea .................. 1996/17974

[51] Int. Cl.$^6$ ................................................. H03K 17/94
[52] U.S. Cl. ........................ 341/22; 341/26; 340/825.79
[58] Field of Search ................................. 341/22, 20, 26, 341/34; 364/709.12; 348/825.79

[56] References Cited

U.S. PATENT DOCUMENTS

| | | | |
|---|---|---|---|
| 4,583,189 | 4/1986 | koyama | 364/709.12 |
| 4,872,008 | 10/1989 | Ohtsuka et al. | 341/26 |
| 4,918,634 | 4/1990 | Nishimori | 364/709.12 |
| 5,057,836 | 10/1991 | Inaba | 341/26 |
| 5,081,453 | 1/1992 | Endoh et al. | 340/825.79 |
| 5,424,731 | 6/1995 | Kronberg | 341/26 |
| 5,510,783 | 6/1996 | Findlater et al. | 341/34 |
| 5,515,040 | 5/1996 | Lee et al. | 340/870.04 |
| 5,521,575 | 5/1996 | Pack | 341/26 |
| 5,534,860 | 7/1996 | Phillips et al. | 341/22 |
| 5,619,196 | 4/1997 | Escobosa | 341/22 |

*Primary Examiner*—Michael Horabik
*Assistant Examiner*—Albert K. Wong
*Attorney, Agent, or Firm*—Robert E. Bushnell, Esq.

[57] ABSTRACT

An ADC (analog digital converter) keypad apparatus controls key inputs according to a voltage divided by a plurality of voltage dividing resistors. The ADC keypad apparatus includes an ADC keypad, an A/D converter for converting a divided voltage which is determined according to a key input, a memory for storing key discriminating data, a display for displaying status information, and a controller for re-establishing the key discriminating data. Upon receiving a key re-establishing signal from the A/D converter due to a change of the divided voltage, the controller provides the display with a display signal for displaying the status information and re-establishes the key discriminating data.

10 Claims, 6 Drawing Sheets

| | VL3 | VL2 | VL1 |
|---|---|---|---|
| HL4 | PB43 . | PB42 . | PB41 1 |
| HL3 | PB33 . | PB32 . | PB31 1 |
| HL2 | PB23 . | PB22 . | PB21 0 |
| HL1 | PB13 . | PB12 . | PB11 1 |

ANALOG TO DIGITAL CONVERTER KEYPAD METHOD AND APPARATUS

CLAIM OF PRIORITY

This application makes reference to, incorporates the same herein, and claims all benefits accruing under 35 U.S.C. §119 from an application for ADC KEYPAD APPARATUS AND METHOD FOR CONTROLLING THE SAME earlier filed in the Korean Industrial Property Office on the $27^{th}$ day of May 1996 and there duly assigned Ser. No. 17974/1996, a copy of which application is annexed hereto.

BACKGROUND OF THE INVENTION

Field of the Invention

The present invention relates to an analog to digital converter keypad apparatus, and more particularly an analog to digital converter keypad apparatus and method of controlling key inputs according to a voltage divided by a plurality of voltage dividing resistors.

Description of the Related Art

Key matrices have been widely used in order to unite a plurality of input keys into one body. A key matrix may include twelve push buttons each of which is connected between corresponding horizontal and vertical lines. The key matrix is connected to a microcomputer or a device which can recognize the key input. When the key matrix is connected to a microcomputer, the horizontal and vertical lines are connected to input and output ports of the microcomputer.

In operation, the microcomputer performs a periodic key scanning with a predetermined time interval in order to receive key inputs from the key matrix. However, such key matrix apparatus have a disadvantage of occupying considerable data bit numbers of the input and output ports of the microcomputer.

Key input apparatus using an analog to digital converter keypad have been proposed for solving the above noted problem. In such an apparatus, a plurality of voltage dividing resistors are connected in series and a plurality of ADC (analog to digital converter) keys consisting of pushbuttons are connected between ground and corresponding nodes formed at the conjunctions of the respective voltage dividing resistors, thereby generating a specific divided voltage according to the key input.

Ideally, the voltage dividing resistors generate a divided voltage ranging from the first supply voltage to the second supply voltage disposed between the series connected voltage dividing resistors. However, each of the ADC keys has a specific contact resistance such that the output voltage varies according to the contact resistance of each ADC key.

In view of this, the microcomputer connected to the analog to digital converter establishes permissible voltage ranges for the inputs of the respective ADC keys to properly recognize the key inputs. Namely, even though the divided voltage is undesirably changed due to the contact resistance, the divided voltage will be valid if it falls within the permissible voltage ranges for each key. The permissible voltage ranges are called "key discriminating data" because they are reference data for discriminating the key inputs.

However, such ADC key input apparatus also have problems that is, since the permissibly voltage ranges of the apparatus including the ADC keypad are determined by the manufacturing process thereof, a key input error may be caused or the key input may be misrecognized in a case where the contact resistance increases for some reason so as to exceed the permissible voltage range. In practice, oxidation of the contact surface of the ADC keys may cause an increase of the contact resistance. Unfortunately, this is not a simple problem that can be easily solve by the user.

The following patents each disclose features in common with the present invention but do not teach or suggest the specifically recited analog to digital converter keypad method and apparatus of the present invention: U.S. Pat. No. 5,424,731 to Kronberg, entitled Remote Two-Wire Data Entry Method And Device, U.S. Pat. No. 5,515,040 to Lee et al., entitled Methods Of Self-Calibration For A Key-Type Mouse, U.S. Pat. No. 5,534,860 to Phillips et al., entitled Multiple Key Array, U.S. Pat. No. 5,619,196 to Escobosa, entitled Single Wire Keyboard Encode And Decode Circuit, U.S. Pat. No. 4,872,008 to Ohtsuka et al., entitled Key Input Device, U.S. Pat. No. 4,918,634 to Nishimori, entitled Key Input Apparatus, U.S. Pat. No. 5,057,836 to Inaba, entitled Data Input Apparatus Having A Microcomputer, U.S. Pat. No. 5,081,453 to Endoh et al., entitled Detecting Apparatus For Detecting Input Operation In A Switching Matrix, U.S. Pat. No. 5,521,575 to Pack, entitled Key Signal Input Circuit For Microcomputer, U.S. Pat. No. 4,583,189 to Koyama, entitled Microprocessor-Based Scan-Mode Keying Circuit, and U.S. Pat. No. 5,510,783 to Findlater et al., entitled Adaptive Keypad.

SUMMARY OF THE INVENTION

It is therefore an ob ject of the present invention to provide an ADC keypad apparatus and method in which the permissible voltage ranges of ADC keys are freely re-establishable in the case where the contact resistance of the ADC keys are changed excessively.

An object of the present invention may be accomplished by an ADC keypad apparatus with a re-establishing function, including an ADC keypad including a plurality of voltage dividing resistors connected in series and a plurality of ADC keys connected respectively to corresponding nodes formed at conjunctions of the voltage dividing resistors, the ADC keypad generating a divided voltage of different levels according to key inputs of the ADC keys; an A/D converter for converting the divided voltage into key input data; a memory for storing key discriminating data for discriminating the key inputs; a display for displaying information; and a controller for comparing the key input data with the key discriminating data to discriminate which one of the ADC keys is being depressed and for executing a corresponding control operation, and for providing the display with a display signal for displaying re-establishment information of the key discriminating data in response to a re-establishing signal for re-establishing the key discriminating data, so as to re-establish the key discriminating data according to a predetermined control process and store the re-established key discriminating data in the memory.

The predetermined control process of the controller determines whether or not the key input from the ADC keypad is the re-establishing signal; providing the display with the display signal, if the key input is the re-establishes signal; re-establishing the key discriminating data according to the key input data from the A/D converter, and stores the re-established key discriminating data in the memory; if the key input is not the re-establishing signal, compares the key input data with the key discriminating data to discriminate whether or not the key input is valid data; and if the key input is valid data, executes a control operation according thereto.

Further, the process re-establishes the key discriminating data and stores the re-established key discriminating data by receiving the key input; re-establishing the key discriminating data according to the key input data from the A/D converter; storing the re-established key discriminating data in the memory; and discriminating whether or not the key discriminating data corresponding to the respective ADC keys are all re-established.

Another object of the present invention may be accomplished by a method for controlling a key input in an ADC keypad apparatus including an ADC keypad having a plurality of voltage dividing resistors connected in series and a plurality of ADC keys connected respectively to corresponding nodes formed at conjunctions of the dividing resistors so as to generate a divided voltage according to key inputs of the ADC keys, an A/D converter for converting the divided voltage into key input data, a memory for storing key discriminating data for discriminating the key inputs, a display for displaying information, and a controller for performing a control operation according to the key inputs, by discriminating whether or not the key input is a re-establishing signal for re-establishing the key discriminating data; providing the display with a display signal for displaying re-establishment information of the key discriminating data, if the key input is the re-establishing signal; re-establishing the key discriminating data according to the key input data from the A/D converter, and storing the re-established key discriminating data in the memory; if the key input is not the re-establishing signal, comparing the key input data with the key discriminating data s to discriminate whether or not the key input is valid data; and if the key input is valid data, executing a control operation according thereto.

The process re-establishes the key discriminating data and stores the re-established key discriminating data by receiving the key input; re-establishing the key discriminating data according to the key input data from the A/D converter; storing the re-established key discriminating data in the memory; and discriminating whether or not the key discriminating data corresponding to the respective ADC keys are all re-established.

According to another embodiment of the present invention, a display apparatus including an ADC keypad having a plurality of voltage dividing resistors connected in series and a plurality of ADC keys connected respectively to corresponding nodes formed at conjunctions of the voltage dividing resistors, the ADC keypad generating a divided voltage in response to a key input of the ADC keys, and OSD (on screen display) means for displaying independent information on a main screen, includes: a memory for storing key discriminating data for discriminating the key input of the ADC keys; and a controller for comparing the key input data with the key discriminating data to discriminate which key of the ADC keys is being depressed and for executing a corresponding control operation, and for generating an OSD signal for displaying re-establishment information for the key discriminating data in response to a re-establishing signal for re-establishing the key discriminating data from the A/D converter so as to re-establish the key discriminating data according to a predetermined control process and store the re-established key discriminating data in the memory.

The predetermined control process includes discriminating whether or not the key input is the re-establishing signal; generating the OSD signal for displaying re-establishment information of the key discriminating data, if the key input is the re-establishing signal; re-establishing the key discriminating data according to the key input data from the AMD converter, and storing the re-established key discriminating data in the memory; if the key input is not the re-establishing signal, comparing the key input data with the key discriminating data to discriminate whether or not the key input is valid data; and if the key input is valid data, executing a control operation according thereto.

Further, the step for re-establishing the key discriminating data and storing the re-established key discriminating data includes receiving the key input; reestablishing the key discriminating data according to the key input data from the AMD converter; storing the re-established key discriminating data in the memory; and discriminating whether or not the key discriminating data corresponding to the respective ADC keys are all re-established.

According to still another embodiment of the present invention, a method for controlling an ADC key input of a display apparatus including an ADC keypad having a plurality of voltage dividing resistors connected in series and a plurality of ADC keys connected respectively to corresponding nodes formed at conjunctions of the voltage dividing resistors, the ADC keypad generating a divided voltage in response to a key input of the ADC keys, a memory for storing key discriminating data for discriminating a key input of the ADC keys, a controller for executing a control process according to the key input, and OSD means for displaying independent information on a main screen, includes the steps of: discriminating whether or not the key input is a re-establishing signal for re-establishing the key discriminating data; generating an OSD signal for displaying re-establishment information of the key discriminating data, if the key input is the re-establishing signal; re-establishing the key discriminating data according to the key input data from the A/D converter, and storing the re-established key discriminating data in the memory; if the key input is not the re-establishing signal, comparing the key input data with the key discriminating data to discriminate whether or not the key input is valid data; and if the key input is valid data, executing a control operation according thereto.

The step for re-establishing the key discriminating data and storing the re-established key discriminating data includes the steps of: receiving the key input; re-establishing the key discriminating data according to the key input data from the A/D converter; storing the re-established key discriminating data in the memory; and discriminating whether or not the key discriminating data corresponding to the respective ADC keys are all re-established.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figures 1, 2:
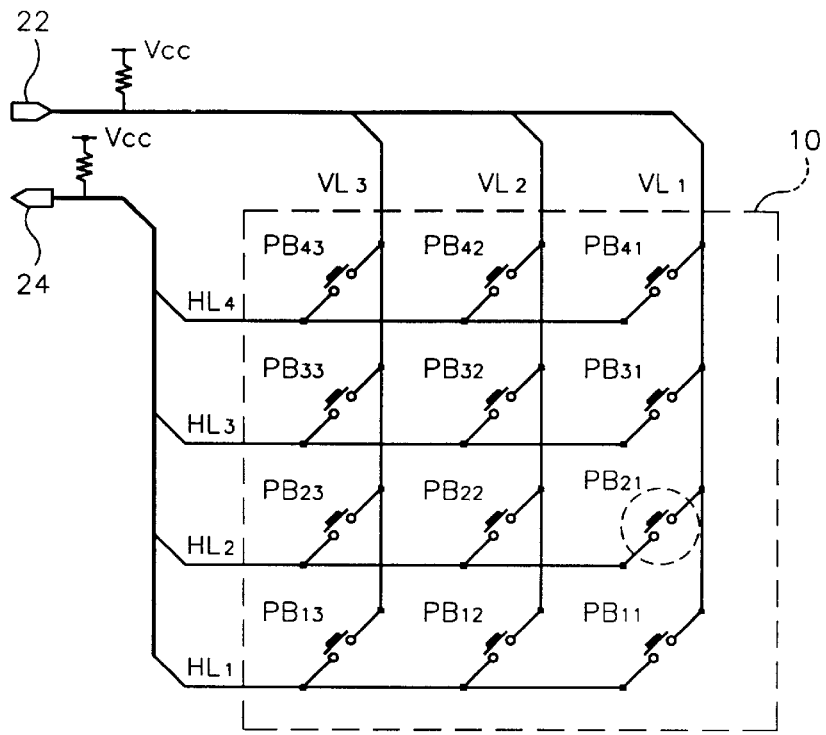
FIG. 1 is a circuit diagram showing an earlier key matrix.
FIG. 2 is a diagram for explaining an operation of the key matrix shown in FIG. 1.

A key matrix has been widely used in order to unite a plurality of input keys into one body. Referring to FIG. 1, an earlier 4×3 key matrix is illustrated, in which a key matrix 10 includes 12 pushbuttons $PB_{43}$–$PB_{11}$ each of which is connected between corresponding horizontal and vertical lines $HL_4$–$HL_1$ and $VL_3$–$VL_1$.

The key matrix 10 is connected to a microcomputer (not shown) or a device which can recognize the key input. When the key matrix 10 is connected to a microcomputer, the horizontal and vertical lines $HL_4$–$HL_1$ and $VL_3$–$VL_1$ are respectively connected to input and output ports 24 and 22 of the microcomputer.

In operation, the microcomputer performs a periodic key scanning with a predetermined time interval (commonly by means of a timer interruption), in order to receive key inputs from the key matrix 10. Specifically, the microcomputer periodically generates a data output to the vertical lines $VL_3$–$VL_1$ through the output port 22 and then, receives key data through the input port 24 to recognize which button is currently being depressed.

Referring to FIG. 2, if data word "110", for example, is supplied to the key matrix 10 through the output port 22 of the microcomputer, only vertical line $VL_1$ is provided with a voltage of a logic low level while the other lines $VL_2$ and $VL_3$ are provided with a voltage of the logic high level. If the pushbutton $PB_{21}$ connected to the vertical line $VL_1$ is depressed, data word "1101" will be supplied to the input port 24. Upon receiving the data word "1101" through the input port 24, the microcomputer recognizes that the pushbutton $PB_{21}$ is being depressed. In this way, the microcomputer generates data circularly in sequence of "110"→"101"→"011"→"110"→"101"→. . . , and the microcomputer discriminates from the key data received through the input port 24 which key is presently depressed.

However, such key input apparatus has the disadvantage of occupying considerable data bit numbers of the input and output ports of the microcomputer.

A key input apparatus using an ADC (analog to digital converter) keypad has been proposed for solving the above stated problem.

Figure 3:
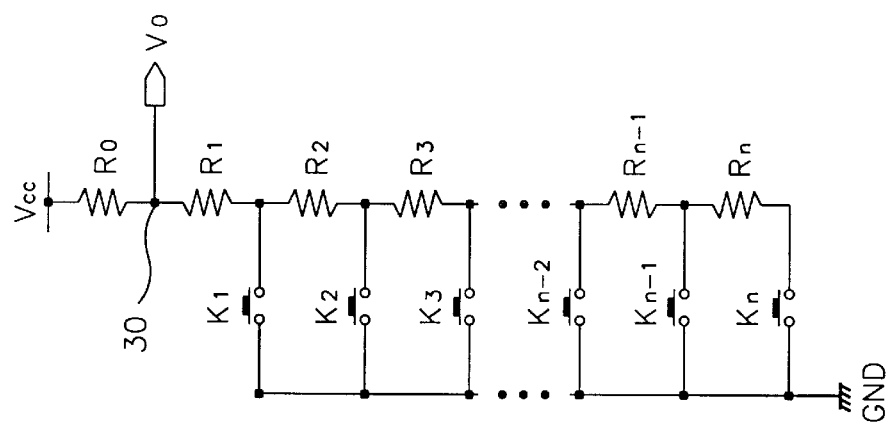
FIG. 3 is a detailed circuit diagram showing an earlier ADC keypad.

Referring to FIG. 3, an ADC keypad is illustrated which includes a plurality of voltage dividing resistors $R_0$–$R_n$ connected in series and a plurality of ADC keys $K_1$–$K_n$ consisting of pushbuttons connected between ground GND and corresponding nodes formed at the conjunctions of the respective voltage dividing resistors $R_1$–$R_n$, thereby generating a specific divided voltage Vo according to the key input.

Figure 4:
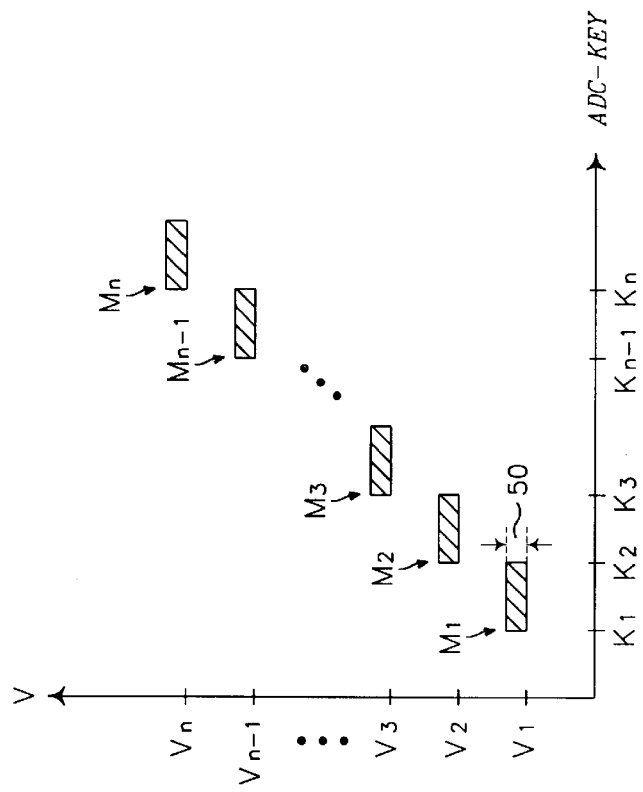
FIG. 4 is a diagram for explaining an operation of the ADC keypad shown in FIG. 3.

Referring to FIGS. 3 and 4, a circuit structure of the ADC keypad and a key input method utilizing the same will be described in detail hereinbelow.

Referring first to FIG. 3, the voltage dividing resistors $R_0$–$R_n$ for dividing a supply voltage Vcc are connected in series between a power supply terminal supplied with a first supply voltage Vcc and another power supply terminal supplied with a second supply voltage GND. An output voltage Vo is generated at a node 30 formed at a conjunction of the resistors $R_0$ and $R_1$. The ADC keys $K_1$–$K_n$ are respectively connected between the second supply voltage GND and the corresponding nodes formed at the conjunctions of the resistors $R_1$–$R_n$.

In operation, the voltage dividing resistors $R_0$–$R_n$ generate the divided voltage Vo ranging from the first supply voltage Vcc to the second supply voltage GND. If the key $K_n$, for example, is depressed, the output voltage Vo will be represented by the following Equation:

$$K_n, V_o = \frac{\sum_{i=1}^{n} R_i}{R_0 + \sum_{i=1}^{n} R_i} \cdot V_{cc} \quad (1)$$

As can be understood from Equation (1), the divided voltage Vo is determined according to a key input of the ADC keys $K_1$–$K_n$ as represented in the following Table 1.

TABLE 1

| ADC key | Divided Voltage (Vo) |
|---|---|
| $K_1$ | $V_o = \dfrac{R_1}{R_0 + R_1} \cdot V_{cc}$ |
| $K_2$ | $V_o = \dfrac{R_1 + R_2}{R_0 + R_1 + R_2} \cdot V_{cc}$ |
| $K_3$ | $V_o = \dfrac{R_1 + R_2 + R_3}{R_0 + R_1 + R_2 + R_3} \cdot V_{cc}$ |
| . | . |
| . | . |
| . | . |
| $K_{n-1}$ | $V_o = \dfrac{R_1 + R_2 + R_3 + \ldots + R_{n-1}}{R_0 + R_1 + R_2 + R_3 + \ldots + R_{n-1}} \cdot V_{cc}$ |
| $K_n$ | $V_o = \dfrac{R_1 + R_2 + R_3 + \ldots + R_{n-1} + R_n}{R_0 + R_1 + R_2 + R_3 + \ldots + R_{n-1} + R_n} \cdot V_{cc}$ |

From Table 1, in the case where the ADC key $K_2$ is depressed, the divided voltage Vo is given by the following Equation:

$$V_o = \frac{R_1 + R_2}{R_0 + R_1 + R_2} \cdot V_{cc} \quad (2)$$

The analog divided voltage Vo generated according to the key input of the ADC keys $K_1$–$K_n$ is converted into digital key input data at the microcomputer to discriminate which ADC key is being depressed.

It is, however, well known that each of the ADC keys $K_1$–$K_n$ has a specific contact resistance $r_n$ according to its characteristic. Thus, the divided voltage Vo can be rewritten as represented by the following Equation:

$$K_n, V_o = \frac{\sum_{i=1}^{n} R_i + r_n}{R_0 + \sum_{i=1}^{n} R_i + r_n} \cdot V_{cc} \quad (3)$$

Referring to FIG. 4, the microcomputer establishes permissible voltage ranges $M_1$–$M_n$ for the key inputs of the respective ADC keys $K_1$–$K_n$ to properly recognize the key inputs. Namely, even though the divided voltage Vo is undesirably changed due to the contact resistance $r_n$, the divided voltage Vo will be valid if it falls within the permissible voltage ranges $M_1$–$M_n$. The permissible voltage ranges are called "key discriminating data", because they are reference data for discriminating the key inputs.

However, such ADC key input apparatus also have problems. That is, since the permissible voltage ranges $M_1$–$M_n$ of an apparatus including the ADC keypad are determined by the manufacturing process thereof, a key input error may be caused or the key input may be misrecognized in the case where the contact resistance $r_n$ increases, for some reason, so as to exceed the permissible voltage ranges $M_1$–$M_n$. In practice, oxidation of the contact surface of the ADC keys $K_1$–$K_n$ may cause an increase of the contact resistance $r_n$. This is not a simple problem that can be easily solved by the user.

Figure 5:
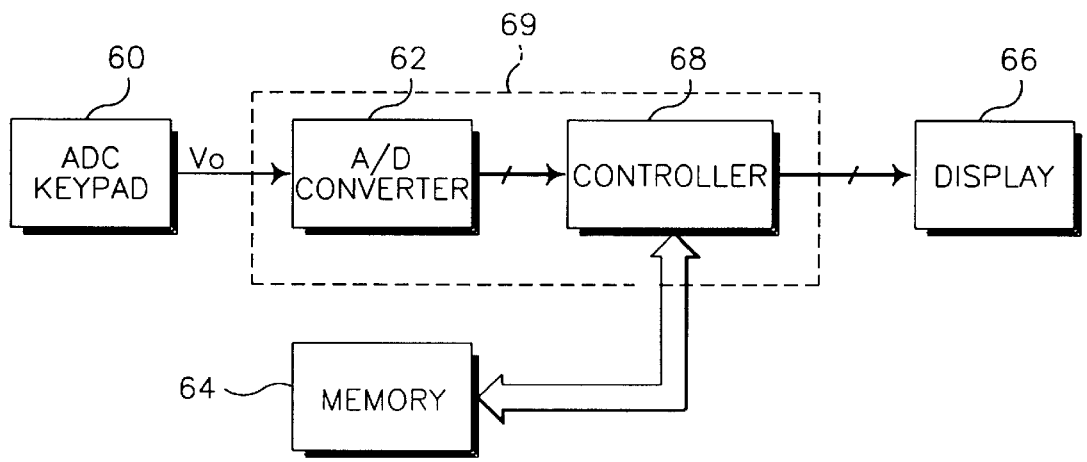
FIG. 5 is a block diagram of an ADC keypad apparatus according to a first embodiment of the present invention.
Figure 6:
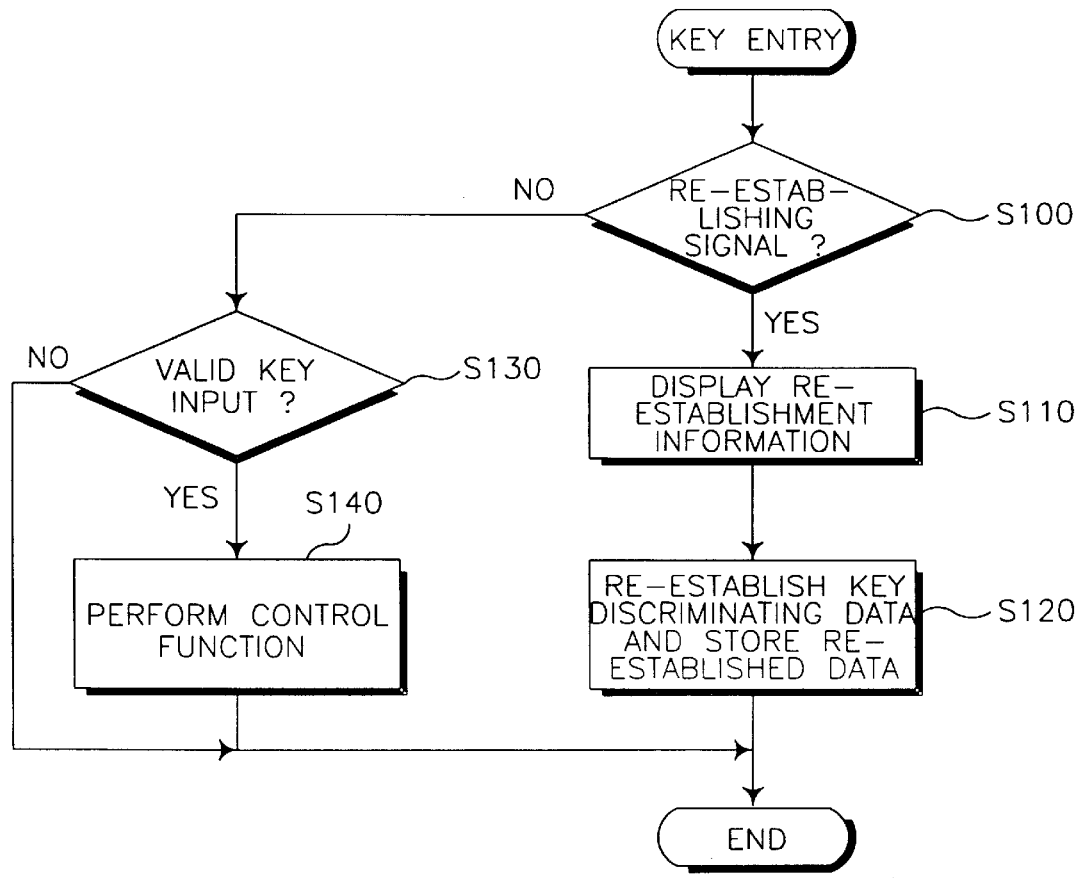
FIGS. 6 and 7 are flowcharts illustrating the controlling of the ADC keypad according to an embodiment of the present invention.
Figure 7:
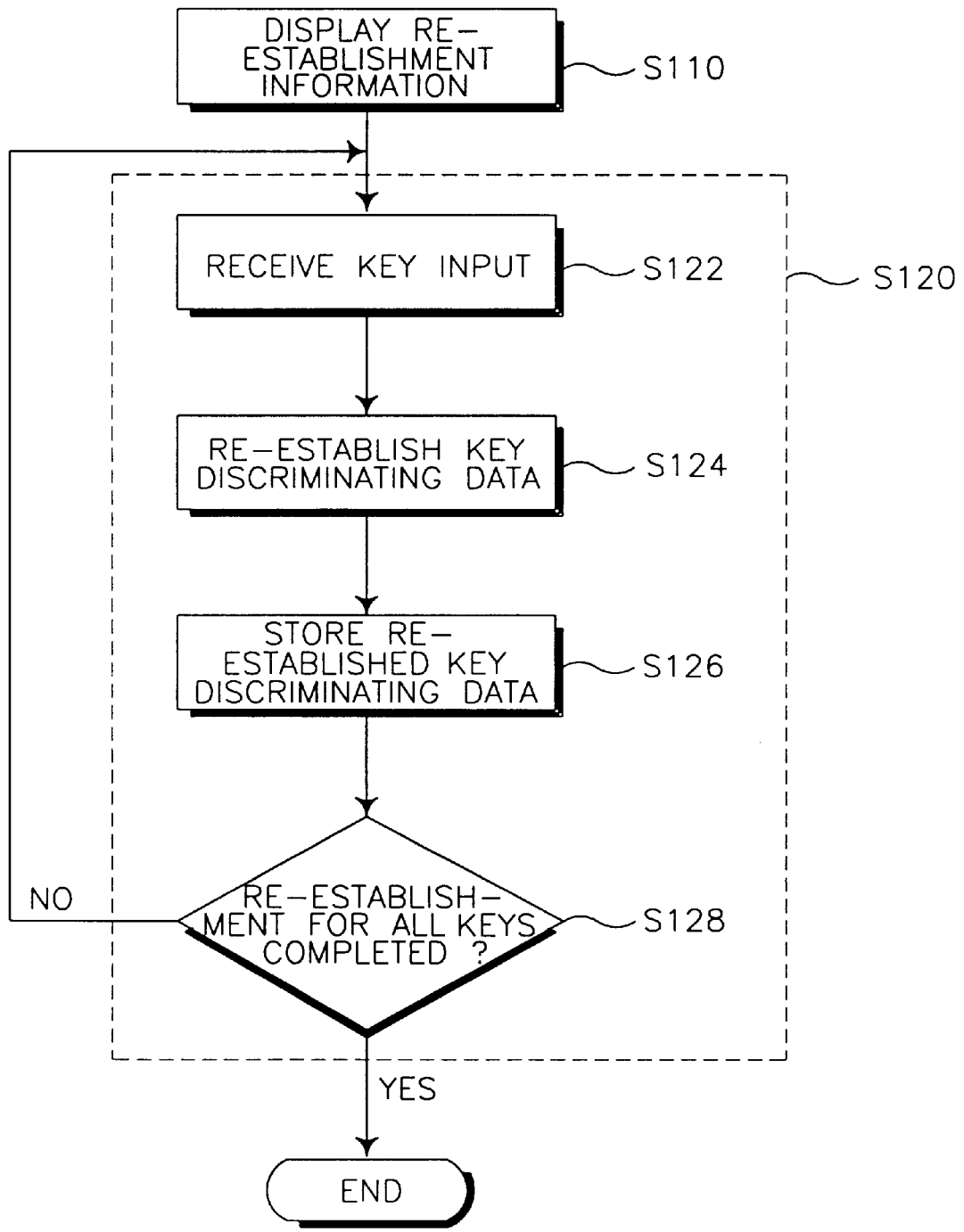

Referring to FIGS. 5 to 7, a novel ADC keypad apparatus according to an embodiment of the present invention includes an ADC keypad 60, an A/D converter 62 for converting an analog divided voltage Vo from the ADC keypad 60 into digital key input data, a memory 64 for storing key discriminating data, a display 66, and a controller 68 for performing a control operation according to the ADC key input. In operation, upon receiving a reestablishing signal for re-establishing the key discriminating data, the controller 68 re-establishes the key discriminating data in accordance with a status of the divided voltage Vo generated from the ADC keypad 60.

The embodiments of the present invention will be described in detail hereinbelow with reference to FIGS. 3 to 9.

Referring to FIG. 5, an ADC keypad apparatus according to a first embodiment of the present invention includes an ADC keypad 60, an A/D converter 62, a memory 64, a display 66, and a controller 68. The ADC keypad 60 includes, as shown in FIG. 3, a plurality of voltage dividing resistors $R_0$–$R_n$ being connected in series for dividing the supply voltage Vcc, and a plurality of ADC keys $K_1$–$K_n$ connected between the ground GND and corresponding nodes formed at the conjunctions of the voltage dividing resistors $R_0$–$R_n$. The ADC keypad 60 generates a divided voltage Vo of different levels according to the key inputs of the ADC keys $K_1$–$K_n$. The A/D converter 62 converts the analog divided voltage Vo into digital key input data. The memory 64 stores the key discriminating data (i.e., reference data) for discriminating the key input from the ADC keypad 60. The controller 68 compares the key input data from the A/D converter 62 with the key discriminating data from the memory 64, to discriminate which one of the ADC keys $K_1$–$K_n$ is being depressed and then, perform a control operation accordingly.

Further, the controller 68 provides the display 66 with a display signal for displaying re-establishment information of the key discriminating data in response to a re-establishing signal, generated by the A/D converter 62, for re-establishing the key discriminating data.

For example, the re-establishing signal may be generated by depressing any selected one of the ADC keys $K_1$–$K_n$ for a predetermined time, or by pressing any selected one of the ADC keys $K_1$–$K_n$ a predetermined number times within a predetermined time period.

In accordance with the re-establishing signal, the controller 68 provides the display 66 with the display signal for displaying the re-establishment information and thereafter, receives the divided voltage Vo from the ADC keypad 60 to re-establish the corresponding key discriminating data and store the re-established key discriminating data in the memory 64.

It may be appreciated that the A/D converter 62 and the controller 68 may be embodied by a microcomputer 69 including an A/D conversion function, and the memory 64 may be embodied by an EEPROM (Electrically Erasable Programmable Read Only Memory) or a flash ROM (Read Only Memory).

Referring to FIGS. 6 and 7, an operation of the ADC keypad apparatus according to the present invention will be described in detail hereinbelow. Upon receiving a key input from the ADC keypad 60, the controller 68 discriminates, at step S100, whether or not the key input is the re-establishing signal for re-establishing the key discriminating data. If the key input is the re-establishing signal, the process proceeds to a step S110; otherwise, the process proceeds to a step S130. At step S110, the display signal for displaying the re-establishment information of the key discriminating data is supplied to the display 66. Consecutively, at step S120, the key discriminating data is re-established based on the key input data from the A/D converter 62, and the re-established key discriminating data is stored in the memory 64. Thus, the original key discriminating data is replaced by the re-established key discriminating data. It should be noted that the key inputs received thereafter are compared with the re-established key discriminating data, to discriminate the key inputs.

FIG. 7 illustrates a flowchart for explaining the step S120 specifically. With reference to the drawing, the key input is received from the ADC keypad 60, at step S122. At step S124, the key discriminating data is re-established according to the key input data from the A/D converter 62. Then, the re-established key discriminating data is stored in the memory 64, at step S126. It is discriminated, at step S128, whether or not the key discriminating data corresponding to the respective ADC keys $K_1$–$K_n$ are all re-established. If the key discriminating data are not all re-established, the process returns to the step S122 to repeat the succeeding steps; otherwise, the process is ended.

At step S130, the key input data from the A/D converter 62 is compared with the key discriminating data from the memory 64 to discriminate whether or not the key input data is valid data. If the input key data is valid data, the process proceeds to a step S140 to perform a control function corresponding to the key input data; otherwise, the process is ended.

As described in detail heretofore, the ADC keypad apparatus according to the first embodiment of the present invention can re-establish the key discriminating data appropriately, in the case where the divided voltage Vo is changed excessively, for some reason, causing a misrecognition of the key input.

Figure 8A:
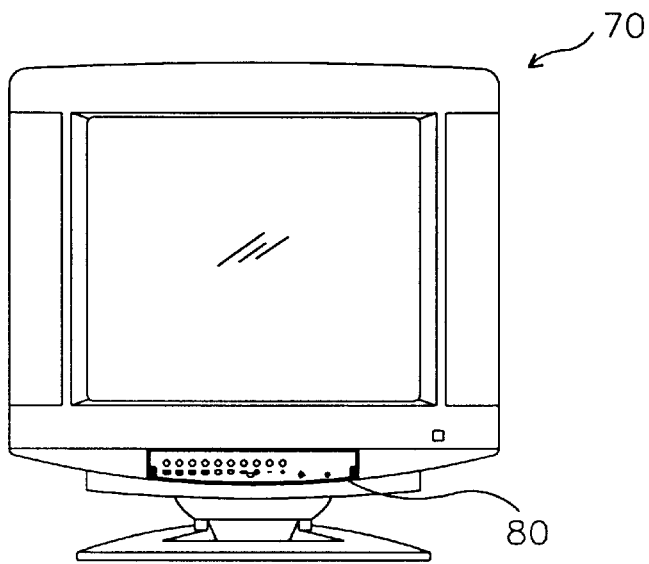
FIG. 8A is a diagram showing a display monitor including an ADC keypad.
Figure 8B:
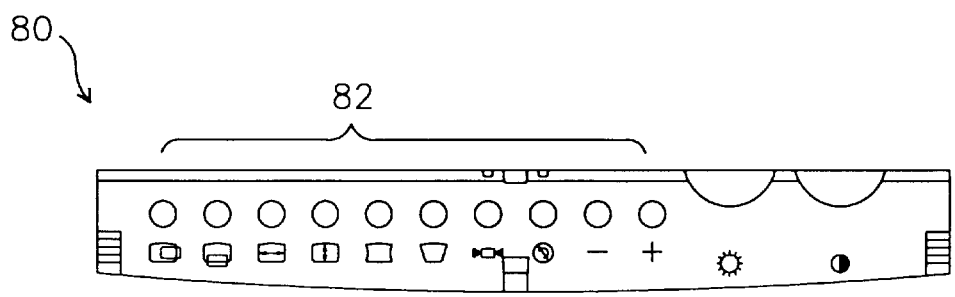
FIG. 8B is an enlarged diagram of an adjusting device attached in the front face of the display monitor shown in FIG. 8A.
Figure 9:
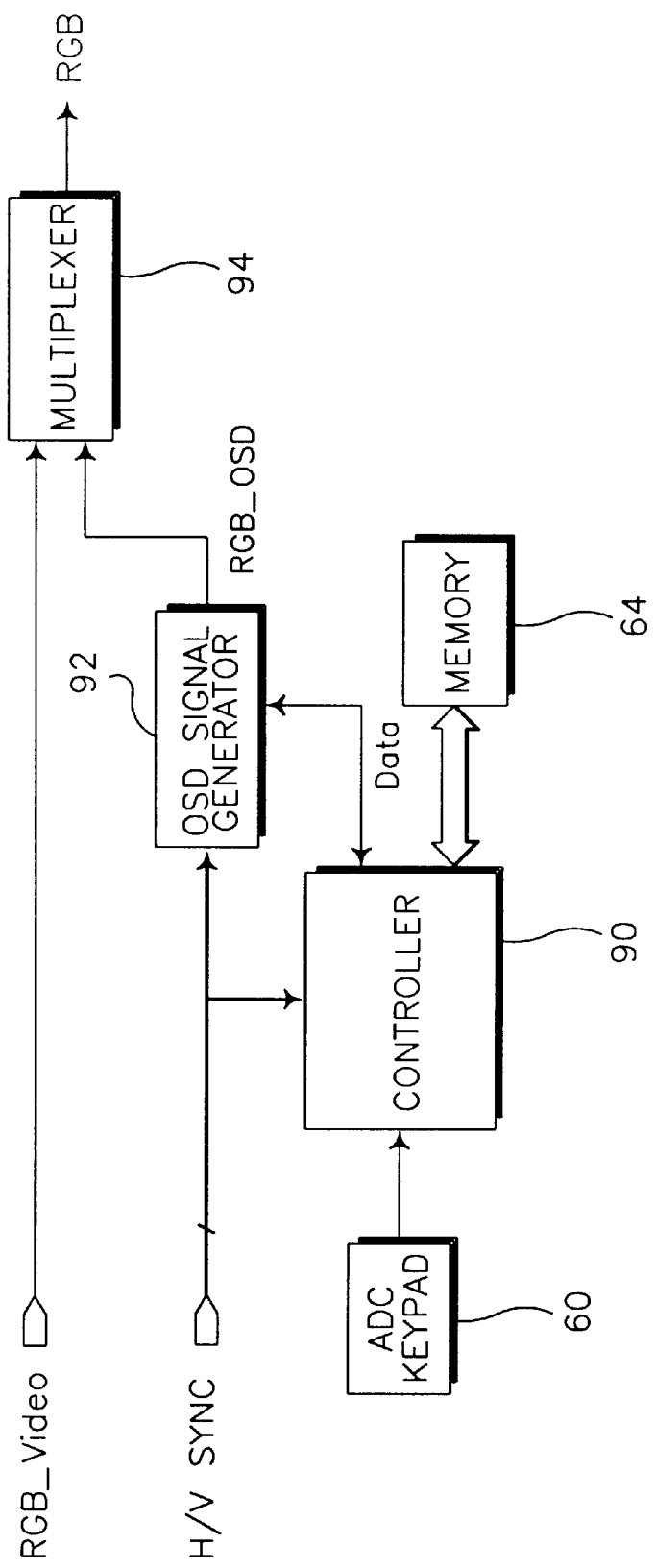
FIG. 9 is a circuit diagram showing a display apparatus according to a second embodiment of the present invention.

Referring to FIGS. 8A to 9, a second embodiment of the present invention will be described in detail hereinbelow. FIG. 8A shows a display monitor including an ADC keypad according to the present invention, in which an adjusting panel 80 is attached in the front face of a computer monitor 70. As shown in FIG. 8B, the adjusting panel 80 includes a screen adjusting keypad 82 comprised of a plurality of ADC keys $K_1$–$K_n$ as shown in FIG. 3. FIG. 9 shows a display apparatus according to a second embodiment of the present invention, which may be contained within in the monitor 70 shown in FIG. 8A. It should be noted that the ADC keypad 60 shown in FIG. 9 is identical to the screen adjusting keypad 82 shown in FIG. 8B.

Referring to FIG. 9, the display apparatus according to the second embodiment of the present invention includes the ADC keypad 60, a controller 90, a memory 64, an OSD signal generator 92, and a multiplexer 94.

The term "OSD (On Screen Display)" mentioned above means a function of overlapping an independent sub-screen on a main screen, to display character and graphic information on the sub-screen. The OSD function may be very useful, for example, to display a control status of the monitor according to the key input from the adjusting panel 80. According to the present invention, for example, the status of a key input error and the re-establishment information of the key discriminating data may be displayed on the sub-screen by using the OSD function. Such an OSD function is controlled by the OSD signal generator 92.

In operation, when there is no key input (i.e., the ADC keypad 60 is not used), the RGB color signal RGB Video from the computer (more specifically, from a video board) is supplied to the monitor 70 through the multiplexer 94. Further, the OSD signal generator 92 receives a horizontal/vertical synchronous signal H/V SYNC generated from the computer and control data from the controller 90 to provide the multiplexer 94 with an OSD color signal OSD RGB. In this case, the OSD function is disabled.

In the meanwhile, alternatively, if the user operates the ADC keypad 60 to adjust the screen, the divided voltage Vo is supplied to the controller 90. The controller 90 converts the divided voltage Vo into the key input data and compares it with the key discriminating data stored in the memory 64, to discriminate the input key and execute corresponding control operation. Then, the OSD signal generator 92 generates the OSD color signal OSD RGB including OSD information (e.g., the status of the key input or the re-establishment message) under the control of the controller 90, thereby displaying the OSD information on the sub-screen.

In similar manner to the first embodiment, when the divided voltage Vo from the ADC keypad 60 is changed excessively for some reason, the controller 60 re-establishes the key discriminating data.

For the convenience of explaining an operation of the second embodiment, reference will be made again to FIGS. 6 and 7.

The controller 90 discriminates, at step S100, whether or not the key input from the ADC keypad 60 is the re-establishing signal for re-establishing the key discriminating data. If the key input is the re-establishing signal, the process proceeds to the step S110; otherwise, the process proceeds to the step S130.

At step S110, the OSD signal for displaying the re-establishment information is generated. Consecutively, at step S120, the key discriminating data is re-established according to the key input data and stored into the memory 64. At step S130, the key input data is compared with the key discriminating data to discriminate whether or not the key input data is valid data. If the input key data is valid data, the process proceeds to the step S140 to perform a control function corresponding to the key input data; otherwise, the process is ended. Further, the detailed process flow of the step S120 is the same as that described in connection with the first embodiment of the present invention.

As described theretofore, the present invention may readily re-establish the key discriminating data in the case where the divided voltage is changed undesirably due to an increase of the contact resistance of the ADC keys in the ADC keypad.

Although various preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. An ADC (Analog-to-Digital converter) keypad apparatus with a re-establishing function, comprising:

an ADC keypad including a plurality of voltage dividing resistors connected in series and a plurality of ADC keys connected respectively to corresponding nodes formed at conjunctions of the voltage dividing resistors, said ADC keypad generating a divided voltage of different levels according to key inputs of the ADC keys;

an A/D (analog-to-digital) converter for converting the divided voltage into key input data;

a memory for storing key discriminating data for discriminating the key inputs;

a display for displaying information; and a controller for comparing the key input data with the key discriminating data to discriminate which one of the ADC keys is being depressed and for executing a corresponding control operation, and for providing the display with a display signal for displaying re-establishment information of the key discriminating data in response to a re-establishing signal, and for re-establishing the key discriminating data in response to the re-establishing signal, said key discriminating data being re-established in accordance with a predetermined control process, and for storing the re-established key discriminating data in the memory.

2. An ADC keypad apparatus with a re-establishing function according to claim 1, the predetermined control process being performed by the controller which comprises:

a means for discriminating whether or not the key input from said ADC keypad is the re-establishing signal;

a means for providing the display with the display signal, if the key input is the re-establishing signal;

a means for re-establishing the key discriminating data according to the key input data from said A/D converter, and storing the re-established key discriminating data in the memory;

a means for comparing the key input data with the key discriminating data to discriminate whether or not the key input is valid data if said key input is not the re-establishing signal; and a means for executing a control operation according thereto if the key input is valid data.

3. An ADC keypad apparatus with a re-establishing function according to claim 2, said means for re-establishing the key discriminating data and storing the re-established key discriminating data comprising:

a means for receiving the key input;

a means for re-establishing the key discriminating data according to the key input data from the A/D converter;

a means for storing the re-established key discriminating data in the memory; and a means for discriminating whether or not the key discriminating data corresponding to the respective ADC keys are all re-established.

4. A method of controlling a key input in an ADC keypad apparatus including an ADC keypad having a plurality of voltage dividing resistors connected in series and a plurality of ADC keys connected respectively to corresponding nodes formed at conjunctions of the dividing resistors so as to generate a divided voltage according to key inputs of the ADC keys, an A/D converter for converting the divided voltage into key input data, a memory for storing key discriminating data for discriminating the key inputs, a display for displaying information, and a controller for performing a control operation according to the key inputs, comprising the steps of:

discriminating whether or not the key input is a re-establishing signal for re-establishing the key discriminating data;

providing the display with a display signal for displaying re-establishment information of the key discriminating data, if the key input is the re-establishing signal;

re-establishing the key discriminating data according to the key input data from said A/D converter, and storing the re-established key discriminating data in the memory;

comparing the key input data with the key discriminating data to discriminate whether or not the key input is valid data if the key input is not the re-establishing signal; and executing a control operation according thereto if said key input is valid data.

5. A method of controlling a key input in an ADC keypad apparatus according to claim 4, said step of re-establishing the key discriminating data and storing the re-established key discriminating data comprising the steps of:

receiving the key input;

re-establishing the key discriminating data according to the key input data from the A/D converter;

storing the re-established key discriminating data in the memory; and discriminating whether or not the key discriminating data corresponding to the respective ADC keys are all re-established.

6. A display apparatus including an ADC keypad having a plurality of voltage dividing resistors connected in series and a plurality of ADC keys connected respectively to corresponding nodes formed at conjunctions of the voltage dividing resistors, said ADC keypad generating a divided voltage in response to a key input of the ADC keys, and an OSD (on screen display) means for displaying independent information on a main screen, comprising:

a memory for storing key discriminating data for discriminating the key input of the ADC keys; and a controller for comparing the key input data with the key discriminating data to discriminate which key of the ADC keys is being depressed and for executing a corresponding control operation, and for generating an OSD signal for displaying re-establishment information for the key discriminating data in response to a re-establishing signal, and for re-establishing the key discriminating data from said A/D converter in response to the re-establishing signal, the key discriminating data being established in accordance with a predetermined control process and for storing the re-established key discriminating data in the memory.

7. A display apparatus including an ADC keypad according to claim 6, said predetermined control process being performed by the controller which comprises:

a means for discriminating whether or not the key input is the re-establishing signal;

a means for generating the OSD signal for displaying re-establishment information of the key discriminating data, if the key input is the re-establishing signal;

a means for re-establishing the key discriminating data according to the key input data from the A/D converter, and storing the re-established key discriminating data in the memory;

a means for comparing the key input data with the key discriminating data to discriminate whether or not the key input is valid data if the key input is not the re-establishing signal; and a means for executing a control operation according thereto if the key input is valid data.

8. A display apparatus including an ADC keypad according to claim 6, said means for re-establishing the key discriminating data and storing the re-established key discriminating data comprising:

a means for receiving the key input;

a means for re-establishing the key discriminating data according to the key input data from the A/D converter;

a means for storing the re-established key discriminating data in the memory; and a means for discriminating whether or not the key discriminating data corresponding to the respective ADC keys are all re-established.

9. A method of controlling an ADC key input of a display apparatus including an ADC keypad having a plurality of voltage dividing resistors connected in series and a plurality of ADC keys connected respectively to corresponding nodes formed at conjunctions of the voltage dividing resistors, said ADC keypad generating a divided voltage in response to a key input of the ADC keys, a memory for storing key discriminating data for discriminating a key input of the ADC keys, a controller for executing a control process according to the key input, and OSD means for displaying independent information on a main screen, the method comprising the steps of discriminating whether or not the key input is a re-establishing signal for re-establishing the key discriminating data;

generating an OSD signal for displaying re-establishment information of the key discriminating data, if the key input is the re-establishing signal;

re-establishing the key discriminating data according to the key input data from the A/D converter, and storing the re-established key discriminating data in the memory;

comparing the key input data with the key discriminating data to discriminate whether or not the key input is valid data, if the key input is not the re-establishing signal; and executing a control operation according thereto, if the key input is valid data.

10. A method of controlling an ADC key input of a display apparatus according to claim 9, said step of re-establishing the key discriminating data and storing the re-established key discriminating data comprising the steps of:

receiving the key input;

re-establishing the key discriminating data according to the key input data from the A/D converter;

storing the re-established key discriminating data in the memory; and discriminating whether or not the key discriminating data corresponding to the respective ADC keys are all re-established.

* * * * *